(12) United States Patent
Dusad et al.

(10) Patent No.: US 9,806,730 B1
(45) Date of Patent: Oct. 31, 2017

(54) APPARATUS HAVING SOURCE FOLLOWER BASED DAC INTER-SYMBOL INTERFERENCE CANCELLATION

(71) Applicant: Texas Instruments Incorporated, Dallas, TX (US)

(72) Inventors: Shagun Dusad, Bangalore (IN); Eeshan Miglani, Chhindwara (IN); Sandeep Jhanwar, Nokha (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/395,673

(22) Filed: Dec. 30, 2016

(51) Int. Cl.
*H03M 1/00* (2006.01)
*H03M 1/08* (2006.01)
*H03M 3/00* (2006.01)

(52) U.S. Cl.
CPC .............. *H03M 1/08* (2013.01); *H03M 1/001* (2013.01); *H03M 3/464* (2013.01)

(58) Field of Classification Search
CPC ......... H03M 1/08; H03M 1/001; H03M 3/464
USPC .................................................. 341/110–125
See application file for complete search history.

(56) References Cited

U.S. PATENT DOCUMENTS

| | | | | |
|---|---|---|---|---|
| 8,922,401 | B1* | 12/2014 | Narumi .................. | H03M 1/18 341/110 |
| 2005/0232174 | A1* | 10/2005 | Onggosanusi ....... | H04B 1/7105 370/286 |
| 2014/0355708 | A1* | 12/2014 | Kang ...................... | H04B 1/12 375/267 |
| 2016/0305794 | A1* | 10/2016 | Horita ................ | G01C 21/3602 |
| 2016/0308698 | A1* | 10/2016 | Talty ...................... | H04B 1/525 |

* cited by examiner

*Primary Examiner* — Lam T Mai
(74) *Attorney, Agent, or Firm* — Gregory J. Albin; Charles A. Brill; Frank D. Cimino

(57) ABSTRACT

A current digital-to-analog converter (DAC) and an integrated circuit chip including the DAC are disclosed. The current DAC includes a switching circuit that includes a plurality of switches coupled to receive differential digital control signals and to provide first and second differential current outputs, a current source coupled to an upper rail and to a first node of the switching circuit, a first current sink coupled to a lower rail and to a second node of the switching circuit, and an interference cancellation circuit coupled to substantially prevent a tail capacitance current from flowing through the first and second differential current outputs.

18 Claims, 8 Drawing Sheets

APPARATUS HAVING SOURCE FOLLOWER BASED DAC INTER-SYMBOL INTERFERENCE CANCELLATION

FIELD OF THE DISCLOSURE

Disclosed embodiments relate generally to the field of current digital to analog converters (DACs). More particularly, and not by way of any limitation, the present disclosure is directed to an apparatus having source follower based DAC inter-symbol interference cancellation.

BACKGROUND

In current DACs the tail node capacitor can cause inter-symbol interference (ISI) or dynamic error as it is switched between nodes with unequal voltages. This is because the tail node capacitance has to be supplied with the difference in charge whenever the two nodes switch between unequal voltages and this charge is generally drawn from the output. These unequal voltages can originate from an offset voltage or can be signal dependent. These modulate with the switching pattern of the DAC elements and cause harmonic distortion or noise degradation. The conventional method for reducing the error caused is to reduce the tail node capacitance of the DAC element and/or reduce the unequal voltages in the nodes.

SUMMARY

Disclosed embodiments provide a current that is buffered and scaled to supply the current needed by the tail capacitor. The provided current is controlled by the output signals to meet the needs of the tail capacitor so that the tail capacitor no longer pulls current from the output nodes. The non-linearity caused by the non-ideality is reduced or cancelled.

In one aspect, an embodiment of a current digital-to-analog converter (DAC) is disclosed. The current DAC includes a switching circuit comprising a plurality of switches coupled to receive differential digital control signals and to provide first and second differential current outputs; a current source coupled to an upper rail and to a first node of the switching circuit; a first current sink coupled to a lower rail and to a second node of the switching circuit; and an interference cancellation circuit coupled to substantially prevent a tail capacitance current from flowing through the first and second differential current outputs.

In another aspect, an embodiment of an integrated circuit (IC) chip is disclosed. The IC chip includes a loop filter; and a digital-to-analog converter coupled to provide first and second differential current outputs towards the loop filter, the DAC comprising a plurality of DAC elements, the DAC elements each comprising: a switching circuit comprising a plurality of switches coupled to receive respective differential digital control signals and to provide respective first and second differential current outputs; a current source coupled to an upper rail and to a first node of the switching circuit; a first current sink coupled to a lower rail and to a second node of the switching circuit; and an interference cancellation circuit coupled to substantially prevent a tail capacitance current from flowing through the first and second differential current outputs.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 4:
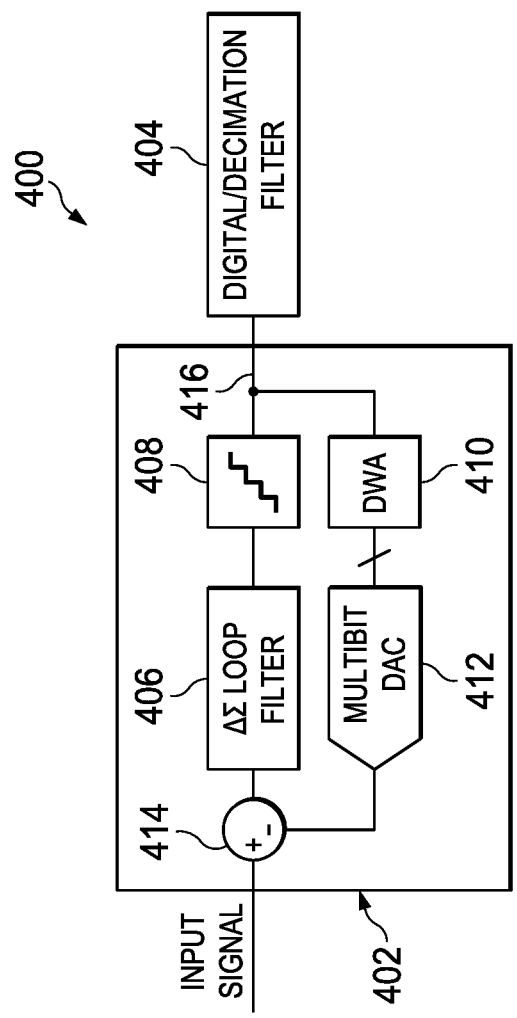
FIG. 4 depicts a system in which the disclosed current DAC can be used according to an embodiment of the disclosure.

Turning first to FIG. 4, a Delta-Sigma (ΔΣ) analog-to-digital converter (ADC) 400 is shown in which the disclosed DAC can be utilized. ΔΣ ADC 400 includes ΔΣ modulator 402, which samples the analog input signal at a very high rate into a one-bit stream, and digital/decimation filter 404, which takes the sampled data and converts it into a high-resolution, slower digital code. Delta sigma modulator 402 includes a ΔΣ loop filter 406, quantizer 408, and a feedback loop that provides an analog version of the output signal of ΔΣ modulator 402. The feedback loop includes a data-weighted averaging (DWA) circuit 410 and multibit DAC 412. The analog feedback signal from DAC 412 is provided to a subtractor 414, which subtracts the feedback signal from the analog input signal to provide a difference value. This difference value is provided to ΔΣ loop filter 406, which amplifies the difference and provides the difference value to quantizer 408, which provides a digital output signal 416. In one embodiment, quantizer 408 includes a flash ADC. Digital output signal 416 is provided to digital/decimation filter 404 and is also provided to the feedback loop. Within the feedback loop, digital weighted averaging is performed by DWA 410 on the output signal, which is then provided to multibit DAC 412 for conversion back to analog for use in adjusting the output signal.

ADC 400 can be utilized in the wireless market and requires both a low signal to noise ratio (SNR) and low power. The supported bandwidth can be quite large, e.g. 100 MHz. Because a delta-sigma ADC is an oversampling data converter, the sampling rate of ΔΣ modulator 402 is much higher than the bandwidth. In one example, the sampling rate is 3.4 GHz. Any error present in DAC 412 will unnecessarily correct ΣΔ loop filter 406, propagating the error into the larger system. The sub-micron technology in which ADC 400 is implemented utilizes low power, requiring low degeneration for current sources to avoid high noise. The high bandwidth means that flicker noise is a significant part of the noise. With the requirements for low flicker noise and low degeneration, larger size transistors are used in the current DAC, leading to a high capacitance tail capacitor, which in turn causes increased inter-symbol interference.

Figure 5B:
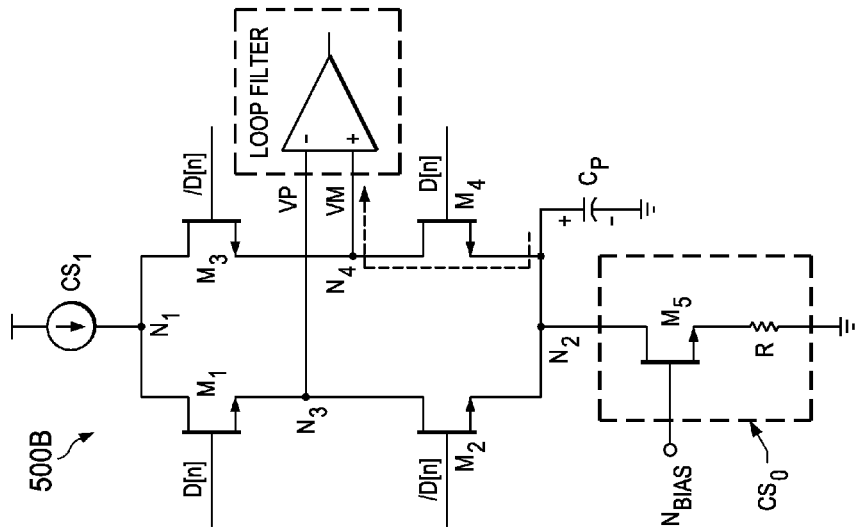
FIGS. 5A and 5B depict one of the problems experienced in a current DAC according to the prior art.
Figure 5A:
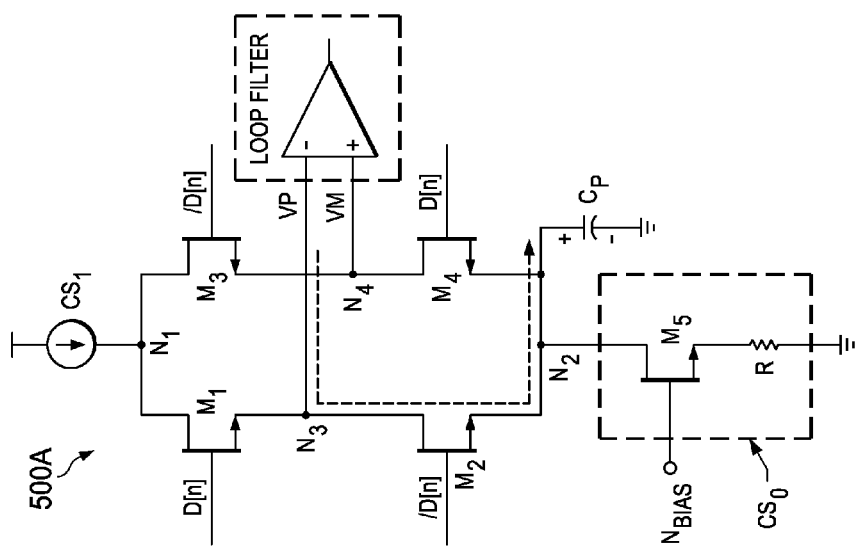

FIGS. 5A and 5B depicts a circuit diagram of a single element 500 of a current DAC according to the prior art. Although the same element is shown in both figures, 500A refers to the element during a period of time when $D_{[n]}$ is zero and 500B refers to the element during the period of time when $D_{[n]}$ is one; references to element 500 are to the structure itself without regard to the timing. Element 500 can be part of a DAC such as multibit DAC 412, which can contain, in one example sixteen to twenty copies of element 500, each coupled to provide a current to differential output signals VP and VM, with each element "n" receiving a respective pair of control signals, $D_{[n]}$ and $/D_{[n]}$. Element 500 includes four switches $M_1$-$M_4$ that are used to steer current to either VP or VM. Switches $M_1$ and $M_2$ are coupled in series between an upper voltage provided by a current source $CS_1$ at node $N_1$ and a lower voltage provided by a current sink $CS_0$ at node $N_2$. Switches $M_1$, $M_2$ are further coupled to be controlled by differential digital input signals $D_{[n]}$ and $/D_N$, with output signal VP being taken from a node $N_3$ that lies between switch $M_1$ and switch $M_2$. Switches $M_3$ and $M_4$ are also coupled in series between the upper voltage provided at node $N_1$ and the lower voltage provided at node $N_2$ and are coupled to be controlled by signals $/D_{[n]}$ and $D_{[n]}$; output signal VM is taken from a node $N_4$ that lies between switch $M_3$ and switch $M_4$.

In the embodiment shown in FIGS. 5A, 5B, switches $M_1$-$M_4$ are implemented as n-type metal oxide silicon (NMOS) transistors whose gates receive one of the differential input signals $D_{[n]}$ and $/D_{[n]}$, although it will be understood that this embodiment of the switches is an example only and other embodiments of switches $M_1$-$M_4$ are also possible. Transistors $M_1$ and $M_4$ are both controlled by input signal $D_{[n]}$ and transistors $M_2$ and $M_3$ are both controlled by input signal $/D_{[n]}$ such that VP and VM are differential signals. In one embodiment, current sink $CS_0$ is implemented as resistor R1 and NMOS transistor $M_{SN}$, which is controlled by bias voltage $N_{BIAS}$. While it is desirable for current sink $CS_0$ to act as an ideal current source, in reality, current sink $CS_0$ will cause a finite capacitance to be present at node $N_2$, which is shown as parasitic capacitor $C_P$. A similar capacitance can also be present at node $N_1$.

Ideally, the voltage on VP and VM will be exactly the same to represent a zero and exactly the same to represent a one. However, due to processing mismatches between transistors, the actual values carried on VP and VM generally vary somewhat. As VP and VM are alternately coupled to node $N_2$, this mismatch causes a charge differential that is equal to the difference in voltage between VP and VM times the capacitance of parasitic capacitor $C_P$. The arrows shown in FIGS. 5A and 5B demonstrate how this can affect the output provided by element 500 when the charge carried on VP is greater than the charge carried on VM. As mentioned earlier, element 500A is shown just after the value of $D_{[n]}$ has changed from one to zero. Capacitor $C_P$ was previously coupled to VM through transistor $M_4$ and carried a capacitance of $VM*C_P$, where $C_P$ here is used to represent the capacitance of the capacitor. Since VP carries a slightly higher voltage than VM, as VP is coupled to capacitor $C_P$, the higher voltage on VP will charge capacitor $C_P$ by an amount that is equal to the difference between the voltages on VP and VM times the capacitance of $C_P$, i.e., $Charge_{differential} = C_P*(VP-VM)$. Charging capacitor $C_P$ pulls a current from output VP, as shown by the arrow in FIG. 5A. Element 500B is shown immediately following the value of $D_{[n]}$ changing from zero to one. Because VM has a lower charge than VP, as VM is coupled to node $N_2$, capacitor $C_P$ discharges to the level of VM, causing a current to flow to VM that is equal in magnitude, but opposite in flow to the previous current out of VP.

Figure 3:
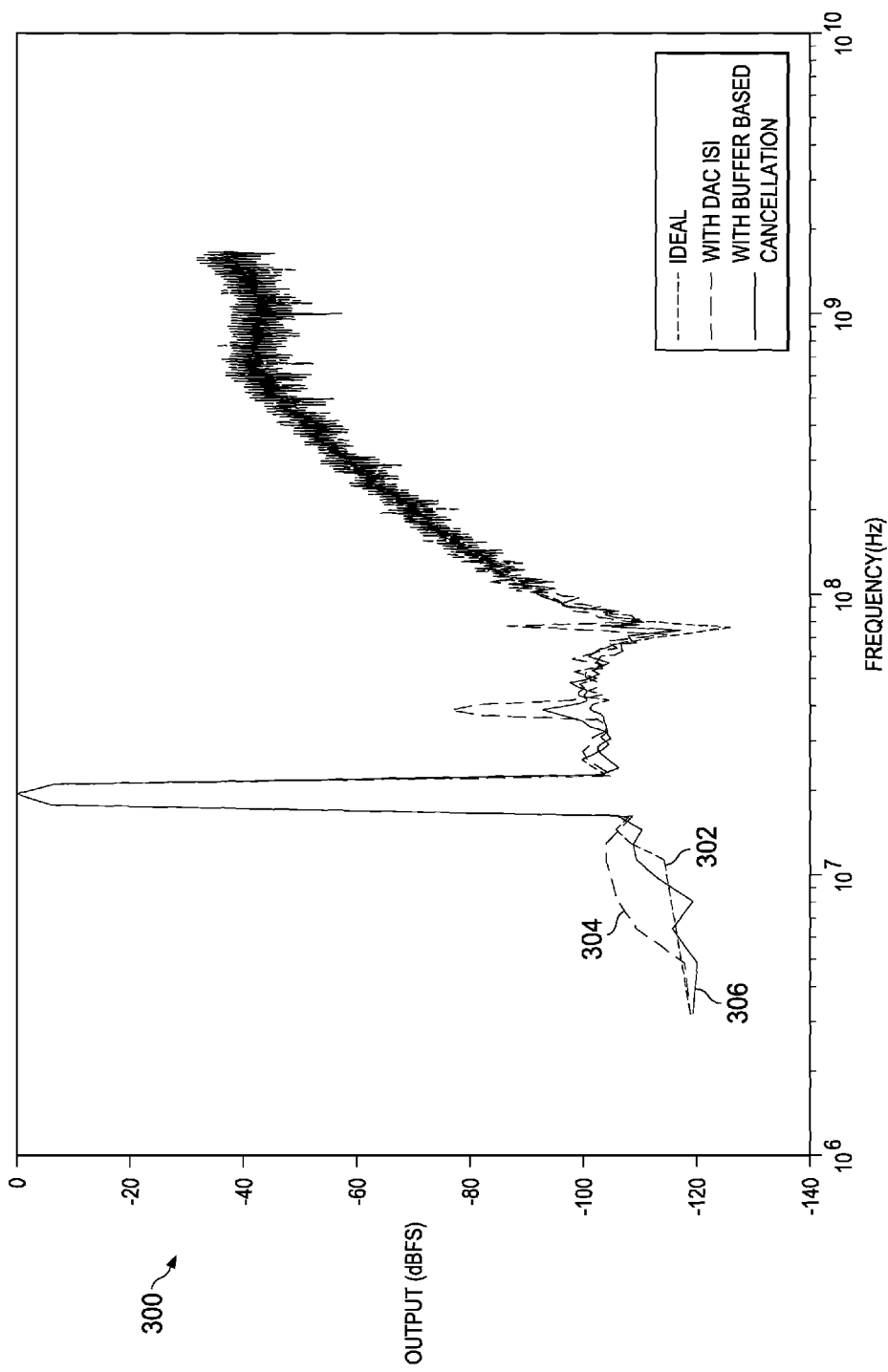
FIG. 3 depicts a graph of the ideal signal quantization noise versus the actual signal quantization noise both with and without the disclosed interference cancellation circuit.

The non-ideality or interference to the output current just discussed recurs with each transition and for each element 500 in the DAC and can be increased by the high capacitance tail capacitor that is dictated by the parameters of the disclosed technology and DAC. The non-idealities affect the performance parameters of the DAC, particularity the non-linearity and affect the quantization error, and produce intermodulation distortion (IMD). IMD is a phenomenon in which non-linearity in a circuit or device creates new frequency components not in the original signal and includes the effects of harmonic distortion. FIG. 3 depicts a graph 300 of the signal quantization noise caused by the conversion of an analog signal to digital and plots the noise as decibels relative to full scale (dBFS) versus the frequency of the signal. The band of interest in graph 300 includes the frequencies at 100 MHz ($10^8$) and lower; noise in the higher frequencies is not a problem FIG. 3 depicts three different curves. Curve 302 is the ideal curve of the error caused by the conversion of the analog signal to digital or quantization error. This quantization error is not constant across the frequency, but is a property of delta-sigma; quantization noise can be shaped using a transfer function of the error to ensure that noise is low in the band of interest, but cannot be removed. Curve 304 discloses the curve of the error as it actually exists using the prior art circuit 500 and shows the deviations from the ideal curve caused by the interference from the tail capacitor. Curve 306 illustrates the quantization noise using the disclosed improvements, which provides much less deviation from the ideal curve. The improvements utilized to provide curve 306 will now be discussed in greater detail.

Figure 1A:
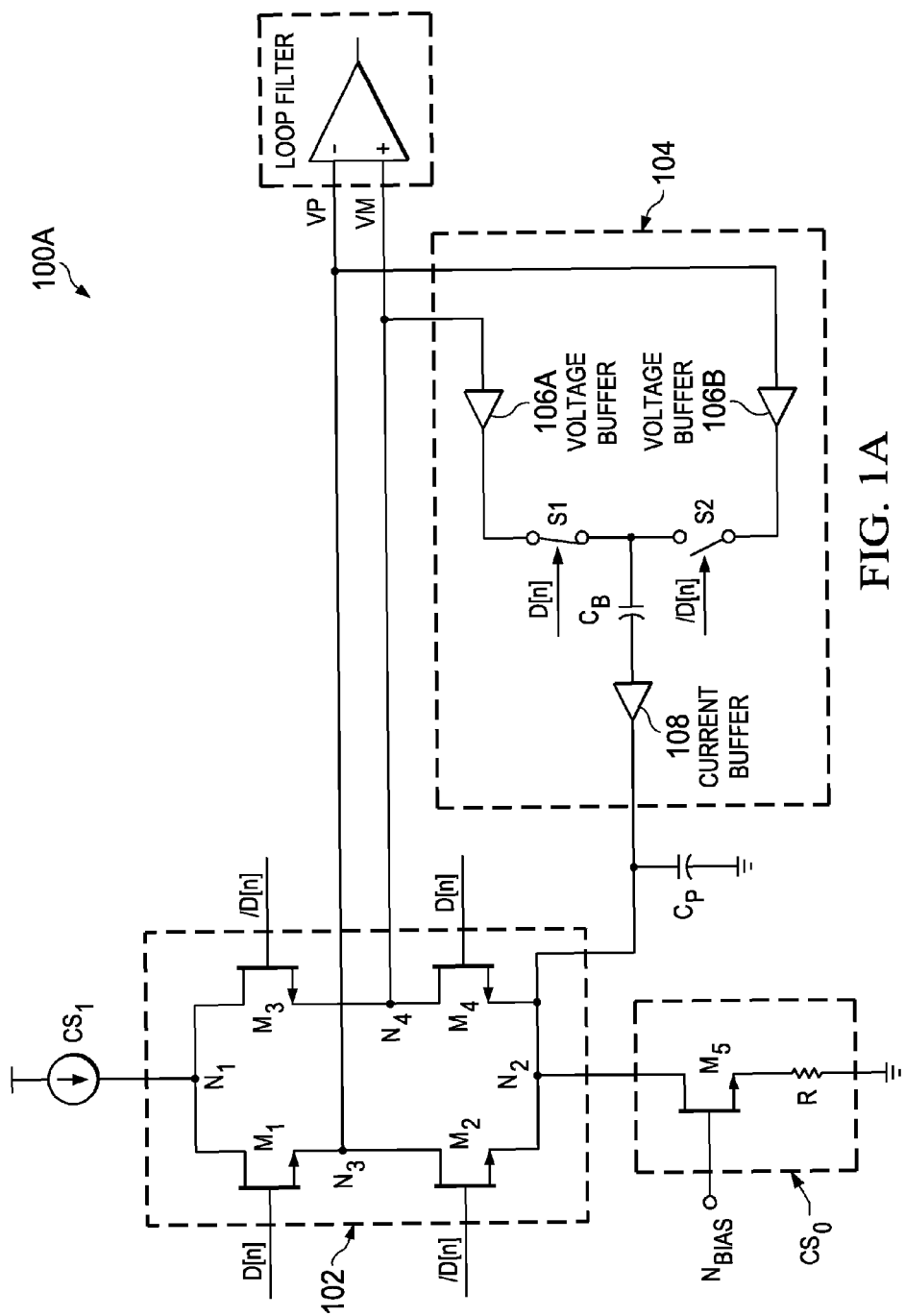
FIGS. 1A-1C each depicts an example element of a current DAC having an interference cancellation circuit according to an embodiment of the disclosure.

Turning next to FIG. 1A, a schematic diagram of a DAC element 100A that includes an interference cancellation circuit 104 is disclosed according to an embodiment of the disclosure. DAC element 100A includes switching circuit 102, which includes four switches, $M_1$-$M_4$ that are coupled to receive differential digital control signals $D_{[n]}$ and $/D_{[n]}$ and to output first and second differential current outputs VP, VM. Current source $CS_1$ is coupled to node $N_1$ of the switching circuit 102 and current sink $CS_0$ is coupled to node $N_2$ of switching circuit 102. As shown, switches $M_1$ and $M_2$ are coupled in series between current source $CS_1$ and current sink $CS_0$, with current output VP being taken from a point between switch $M_1$ and switch $M_2$. Similarly, switches $M_3$ and $M_4$ are coupled in series between current source $CS_1$ and current sink $CS_0$, with current output VM being taken from a point between switch $M_3$ and switch $M_4$. In one embodiment, switches $M_1$-$M_4$ are implemented as NMOS transistors. In one embodiment, current sink $CS_0$ is implemented as an NMOS transistor $M_{5N}$ that has a drain coupled to node $N_2$, a gate coupled to a bias voltage, $N_{BIAS}$, and a source coupled to a first terminal of resistor R1. A second terminal of resistor R1 is coupled to the lower rail. Tail capacitance at node $N_2$ is again shown as parasitic tail capacitor $C_P$.

Since the inter-symbol interference is caused by the changing capacitance on parasitic capacitor $C_P$, which can draw or supply current to current outputs VP, VM, interference cancellation circuit 104 provides a counter current that can supply the difference in charge required by capacitor $C_P$ without drawing or supplying current to the current outputs VP and VM. Interference cancellation circuit 104 includes two voltage buffers 106A, 106B. In one embodiment, voltage buffers 106A, 106B are amplifiers that may or may not provide gain to the voltage received. Voltage buffer 106A receives a voltage from output signal VM and voltage buffer 106B receives a voltage from output signal VP. The output voltage from voltage buffers 106A, 106B are coupled alternately through switches S1 and S2 to a buffer capacitor $C_B$. Switches S1 and S2 are controlled respectively by input signals D[n] and /D[n] to provide their respective voltages to a first terminal of capacitor $C_B$. In one embodiment, voltage buffer 106A is coupled to capacitor $C_B$ during a first time period when node $N_2$ is coupled through switch $M_4$ to output signal VM. Similarly, voltage buffer 106B is coupled to capacitor $C_B$ during a second time period when node $N_2$ is coupled through switch $M_2$ to output signal VP.

While a first terminal of capacitor $C_B$ is coupled to voltage buffers 106A, 106B, the second terminal of capacitor $C_B$ is coupled to current buffer 108, which is coupled to provide an output current towards node $N_2$. Capacitor $C_B$ is sized to be equal in capacitance to capacitor $C_P$, but to present an opposite polarity towards node $N_2$. As the voltage on $C_P$ changes, the voltage on $C_B$ also changes. Voltage buffers 106A, 106B thus buffer respective voltages from VP and VM to capacitor $C_B$ without drawing any current from the output signals. Current buffer 108 will then buffer a current from capacitor $C_B$ towards node $N_2$ and thereby supply a desired amount of current to capacitor $C_P$ when required. By using interference cancellation circuit 104, the termination voltages VP, VM of DAC element 100 are buffered by voltage buffers 106, switched by switches $S_1$, $S_2$, and coupled through capacitor $C_B$ and current buffer 108 to provide current required by tail capacitor $C_P$ The effect of tail capacitor $C_P$ on output node VP and VM is largely nullified and the signal thereby improved.

Figure 1B:
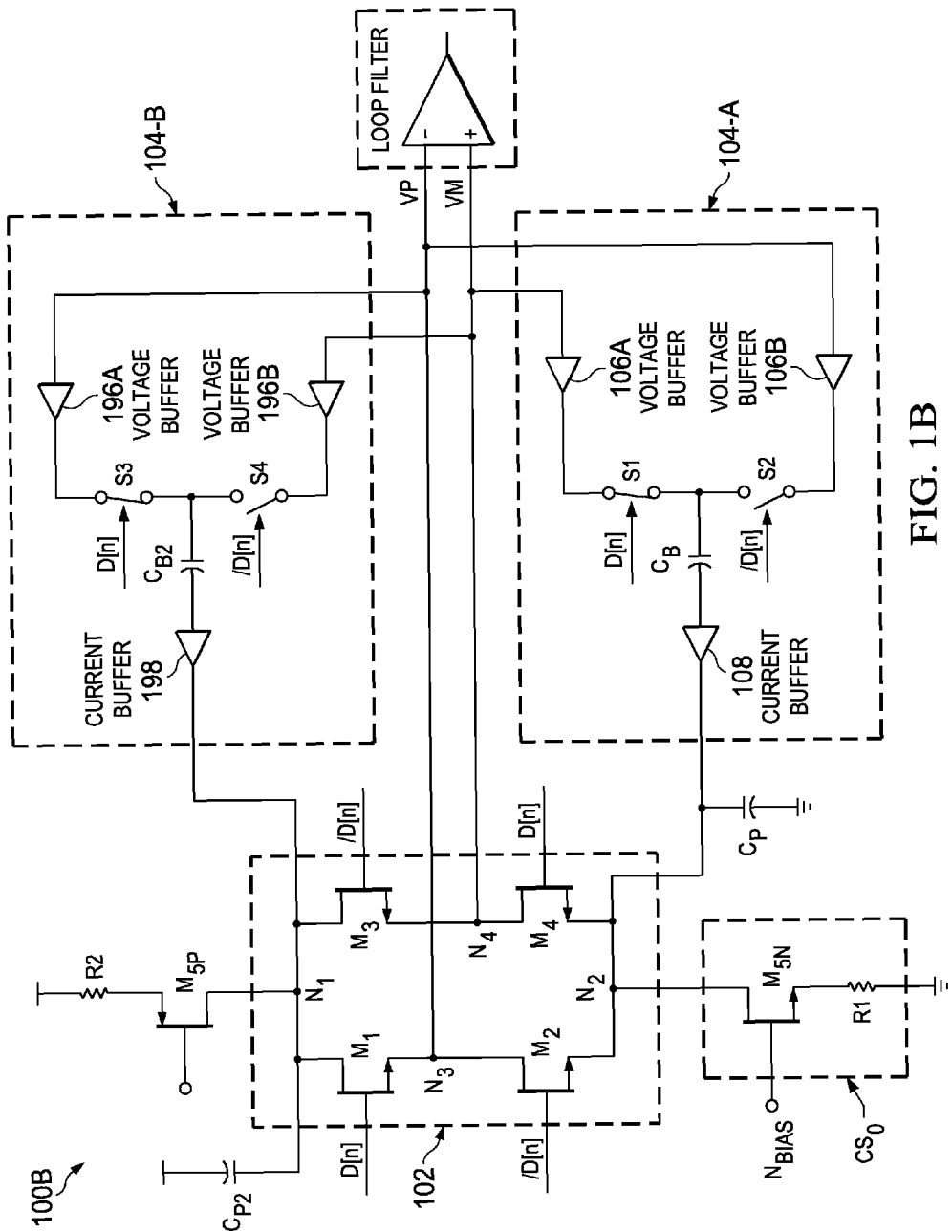

The parasitic capacitance that has been discussed with regard to node $N_2$ can also be present on node $N_1$, where current source $CS_0$ can be implemented as a resistor $R_2$ and p-type metal oxide silicon (PMOS) transistor $M_{5P}$, as seen in FIG. 1B. Although these parasitic capacitances are different, they are problematic in a similar manner. In element 100B, the interference cancellation circuit is implemented as circuit 104-A, which includes voltage buffers 106A, 106B and current buffer 108 for the NMOS section of switching circuit 102, and circuit 104-B, which includes voltage buffers 196A, 196B and current buffer 198B for the PMOS side of switching circuit 102. Each of voltage buffers 106A, 196B receives a voltage from output signal VM and each of voltage buffers 106B, 196A receives a voltage from output signal VP. Similar to the switching of voltage buffers 106A, 106B, the output voltage from voltage buffers 196A, 196B are coupled alternately through switches S3 and S4 to a buffer capacitor $C_{B2}$. Switches S3 and S4 are controlled respectively by input signals D[n] and /D[n] to provide their respective voltages to a first terminal of capacitor $C_{B2}$.

Capacitor $C_{B2}$ has a first terminal coupled to voltage buffers 196A, 196B and a second terminal coupled to current buffer 198, which is coupled to provide an output current towards node $N_1$. Capacitor $C_{B2}$ is sized to be equal in capacitance to the parasitic capacitance on node N1, but again to present an opposite polarity towards node $N_1$. As the capacitance experienced at node $N_1$ changes, the capacitance carried on $C_{B2}$ also changes. Voltage buffers 196A, 196B buffer respective voltages from VP and VM to capacitor $C_{B2}$ without drawing current from the output signals. Current buffer 198 buffers a current from capacitor $C_B$ towards node $N_1$ and thereby supplies a desired amount of current to counteract the capacitance at node $N_1$ when required.

Figure 1C:
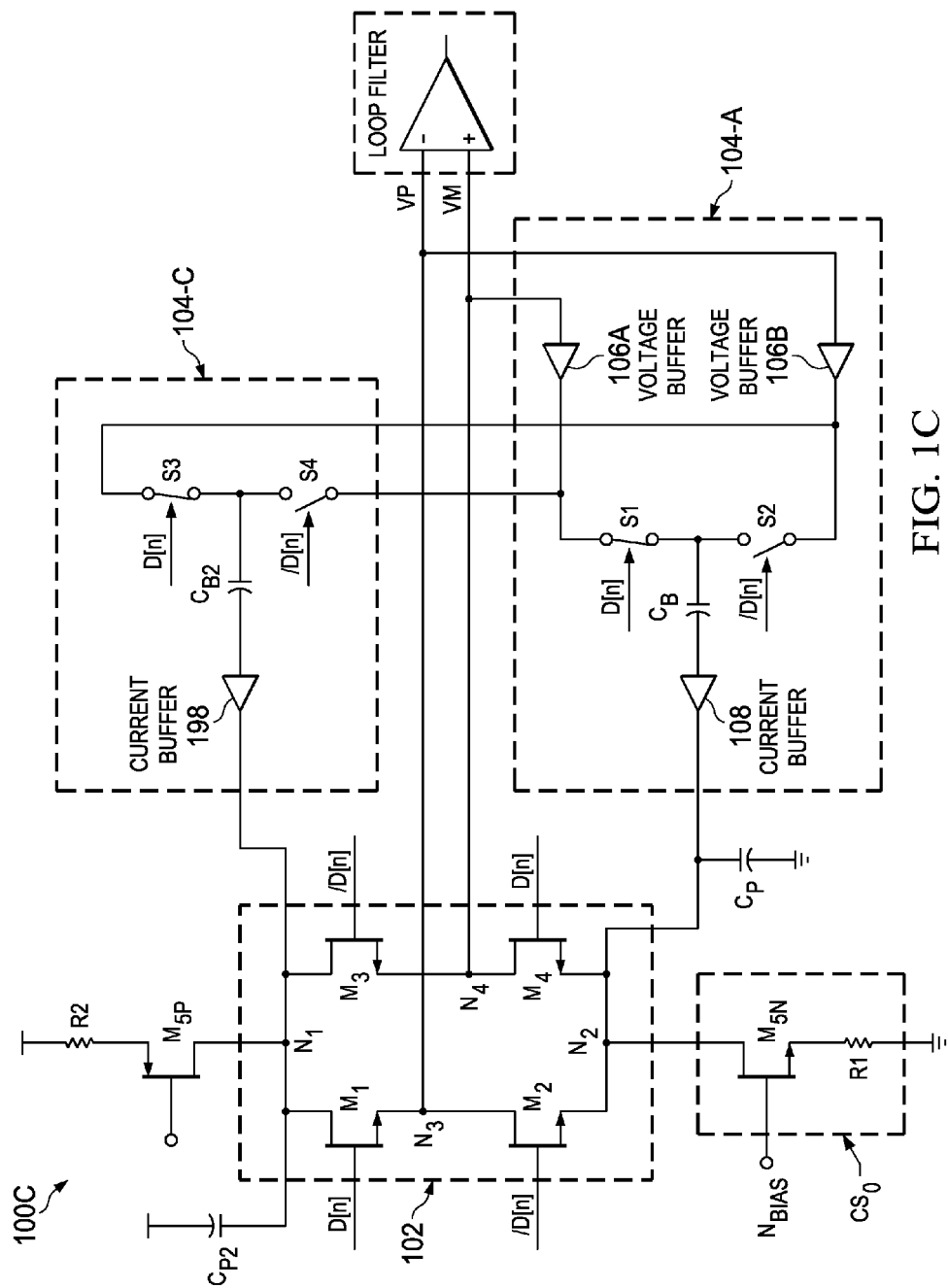

FIG. 1C depicts an embodiment of interference cancellation circuit 104 that provides correction of the capacitance on both the NMOS and PMOS sides of switching circuit 102, but utilizes only one set of voltage buffers to drive two current buffers. In element 100C, the interference cancellation circuit is implemented as circuit 104-A, which includes voltage buffers 106A, 106B and also includes current buffer 108 for the NMOS section of switching circuit 102, and circuit 104-B, which includes current buffer 198B for the PMOS side of switching circuit 102. Voltage buffer 106A provides a voltage to switches S1 and S4, while voltage buffer 196B provides a voltage to switches S2 and S3.

Figure 2A:
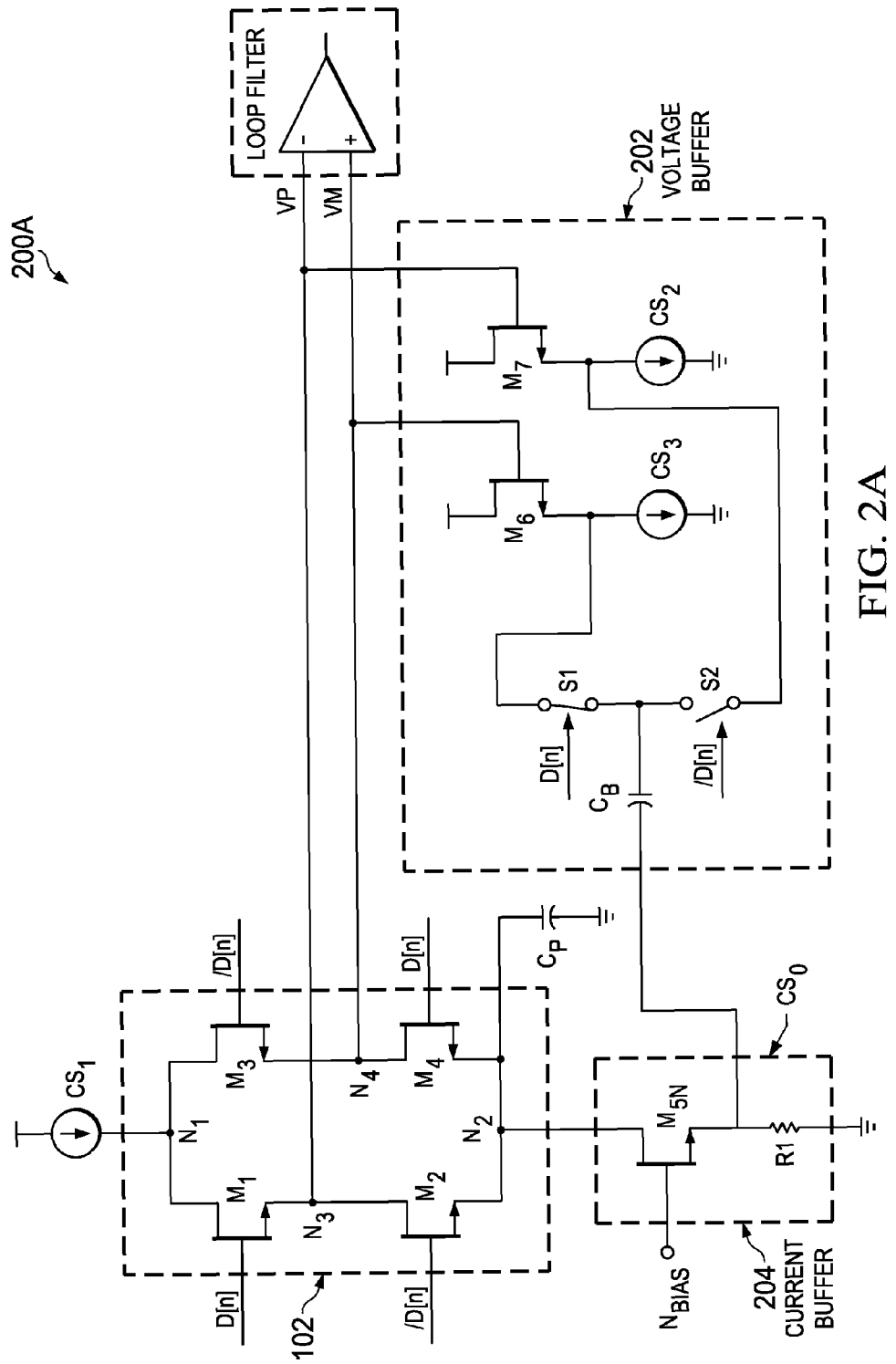
FIGS. 2A and 2B each depicts an example implementation of the interference cancellation circuit in a current DAC according to an embodiment of the disclosure.

While FIGS. 1A-1C depict schematic diagrams of three embodiments of interference cancellation circuit 104, FIG. 2A depicts one embodiment of an implementation of the circuit of FIG. 1A, although it will be understood that there are multiple ways to implement the disclosed circuit. In circuit 200A, voltage buffer 202 is implemented as two NMOS transistors $M_6$, $M_7$, each of which is coupled to a respective current sink $CS_3$, $CS_4$. Transistors $M_6$, $M_7$ can also be implemented as PMOS transistors or as bipolar transistors, either PNP or NPN. Transistor $M_6$ has a drain coupled to the upper rail, a source coupled to current sink $CS_3$ and a gate coupled to output signal VM; the output of the voltage buffer that includes transistor $M_6$ is taken between the source of transistor $M_6$ and current sink $CS_3$. Similarly, transistor $M_7$ has a drain coupled to the upper rail, a source coupled to current sink $CS_0$ and a gate coupled to output signal VP; the output of the voltage buffer that includes transistor $M_7$ is taken between the source of transistor $M_7$ and current sink $CS_0$. The voltages provided by the two voltage buffers are alternately coupled to a first terminal of capacitor $C_B$ by switches $S_1$ and $S_2$, which can be implemented as NMOS transistors or PMOS transistors. Switches $S_1$, $S_2$ are switched by signals $D_{[n]}$ and $/D_{[n]}$, so that once again capacitor $C_B$ carries the same charge as capacitor $C_P$, but presents the opposite polarity to node $N_2$. The output from the second terminal of capacitor $C_B$ is provided to node $N_2$ through transistor $M_{5N}$, thus reusing the current source of DAC element 500 as a current buffer.

Figure 2B:
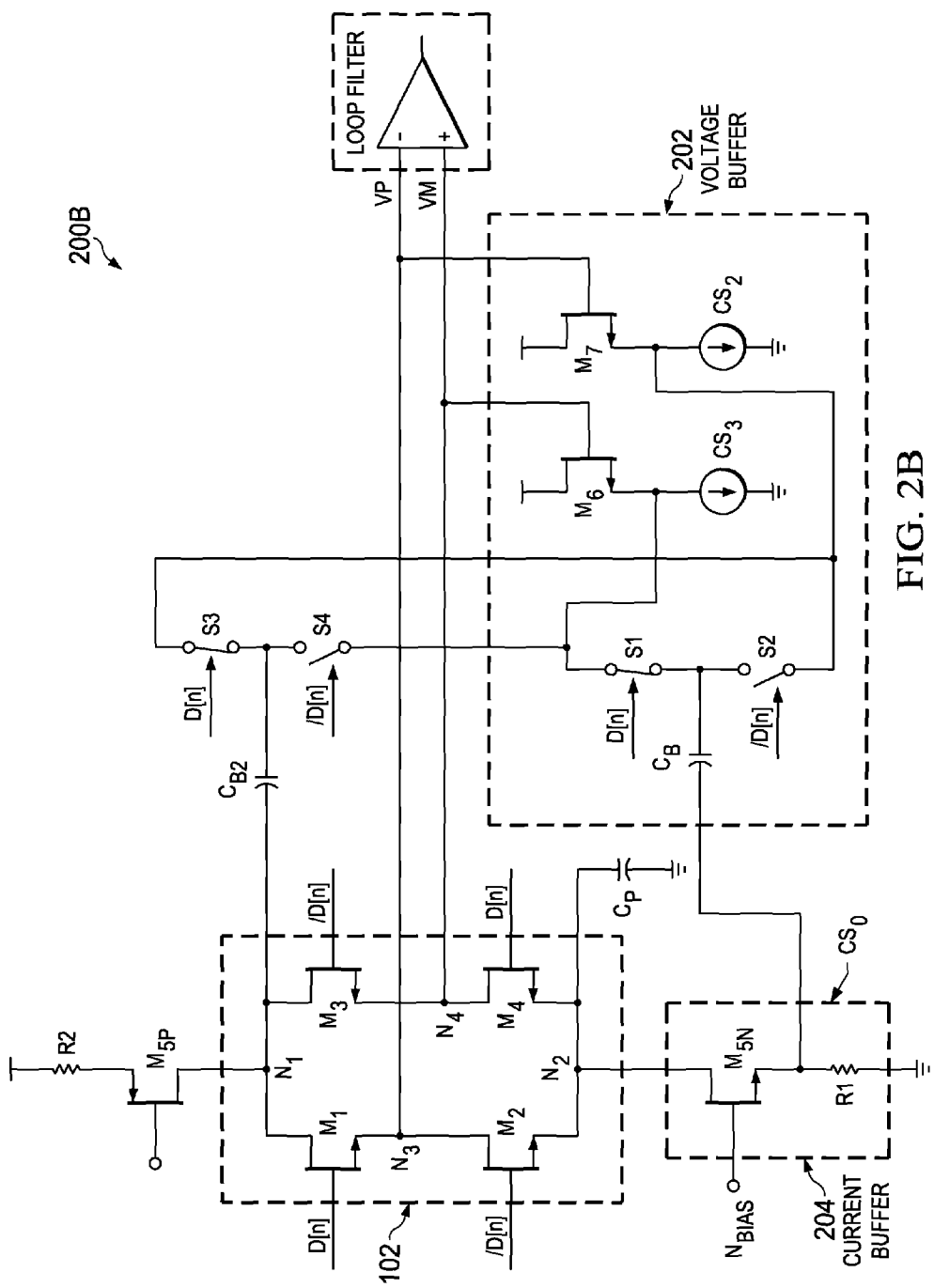

FIG. 2B depicts an embodiment of an implementation of the circuit of FIG. 1C, although again, there are multiple ways to implement the disclosed circuit. In circuit 200B, voltage buffer 202 is again shown as two transistors $M_6$, $M_7$.

The output of the voltage buffer that includes transistor $M_6$ is provided to capacitors $C_B$ and $C_{B2}$ through switches S1 and S4 and the output of the voltage buffer that includes transistor $M_7$ is provided to capacitors $C_B$ and $C_{B2}$ through switches S2 and S3. Similar to the output from the second terminal of capacitor $C_B$, which is provided to node $N_2$ through transistor $M_{5N}$, the output from the second terminal of capacitor $C_{B2}$ is provided to node $N_1$ through transistor $M_{6P}$, reusing the current source as a second current buffer. It will be understood that this circuit can also be implemented with separate voltage buffers for the NMOS side and the PMOS side of the switching circuit.

An interference cancellation circuit that cancels inter-symbol interference for a current DAC has been demonstrated in a number of embodiments. The interference cancellation circuit provides a buffered current that substantially cancels the current necessary to maintain a tail capacitor that is switched between unequal voltages. The interference cancellation circuit draws no current from the output signals and provides no additional capacitance at the tail node. The voltage from the respective output sources is buffered by two voltage buffers and provided to a buffer capacitor. The buffer capacitor provides a current through a current buffer towards a node to which the tail capacitor is coupled. As was shown in FIG. 3, the disclosed embodiments demonstrate a quantization error curve that falls much closer to the ideal curve 302 than does the prior art circuit. Table 1 depicts the SNR and HD2 of the DAC both with correction and without correction.

TABLE 1

|     | Without Correction | With Correction |
|-----|--------------------|-----------------|
| SNR | 75 dBFS            | 84.5 dBFS       |
| HD2 | 75.2               | 93 dBc          |

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A current digital-to-analog converter (DAC) comprising:
    a switching circuit comprising a plurality of switches coupled to receive differential digital control signals and to provide first and second differential current outputs;
    a current source coupled to an upper rail and to a first node of the switching circuit;
    a first current sink coupled to a lower rail and to a second node of the switching circuit; and
    an interference cancellation circuit coupled to substantially prevent a tail capacitance current from flowing through the first and second differential current outputs.

2. The DAC as recited in claim 1 wherein the interference cancellation circuit is further coupled to receive respective voltages from the first and second differential current outputs and to provide a first buffered current towards the second node.

3. The DAC as recited in claim 2 wherein the interference cancellation circuit is further coupled to provide a second buffered current towards the first node.

4. The DAC as recited in claim 2 wherein the interference cancellation circuit comprises:
    a first buffer capacitor;
    a first voltage buffer coupled to selectively provide the respective voltage from the first differential current output to the first buffer capacitor;
    a second voltage buffer coupled to selectively provide a voltage from the second differential current output to the first buffer capacitor; and
    a first current buffer coupled to receive a first buffered current from the first buffer capacitor and to provide the first buffered current towards the second node.

5. The DAC as recited in claim 4 wherein the interference cancellation circuit further comprises:
    a second buffer capacitor; and
    a second current buffer coupled to receive a second buffered current from the second buffer capacitor and to provide the second buffered current towards the first node;
    wherein the first voltage buffer is further coupled to selectively provide the respective voltage from the first differential current output to the second buffer capacitor and the second voltage buffer is further coupled to selectively provide the voltage from the second differential current output to the second buffer capacitor.

6. The DAC as recited in claim 4 wherein the interference cancellation circuit further comprises:
    a second buffer capacitor;
    a third voltage buffer coupled to selectively provide the respective voltage from the first differential current output to the second buffer capacitor;
    a fourth voltage buffer coupled to selectively provide the voltage from the second differential current output to the second buffer capacitor; and
    a second current buffer coupled to receive a second buffered current from the second buffer capacitor and to provide the second buffered current towards the first node.

7. The DAC as recited in claim 4 wherein the first and second voltage buffers comprise first and second amplifiers.

8. The DAC as recited in claim 4 wherein the first voltage buffer is coupled to the first buffer capacitor during a first time period when the second node is coupled to the first differential current output and the second voltage buffer is coupled to the first buffer capacitor during a second time period when the second node is coupled to the second differential current output.

9. The DAC as recited in claim 8 wherein the first voltage buffer comprises a first transistor having a gate coupled to the first differential current output, a drain coupled to the upper rail and a source coupled to a second current sink, a first current taken between the first transistor and the second current sink being selectively coupled to the first buffer capacitor and the second voltage buffer comprises a second transistor having a gate coupled to the second differential current output, a drain coupled to the upper rail and a source coupled to a third current sink, a second current taken between the second transistor and the third current sink being selectively coupled to the buffer capacitor.

10. The DAC as recited in claim 9 wherein the first and second transistors are selected from a group consisting of n-type metal oxide silicon (NMOS) transistors, p-type metal oxide silicon (PMOS) transistors, NPN bipolar transistors and PNP bipolar transistors.

11. The DAC as recited in claim 9 wherein the first current sink comprises an NMOS transistor having a drain coupled to the second node of the switching circuit, a source coupled to a first terminal of a first resistor and a gate coupled to receive a bias voltage, the second terminal of the first resistor being coupled to the lower rail.

12. The DAC as recited in claim 11 wherein the first current buffer comprises the NMOS transistor and the first resistor, the current from the first buffer capacitor being coupled to a point between the NMOS transistor and the first resistor.

13. The DAC as recited in claim 11 wherein the current source comprises a PMOS transistor having a drain coupled to the first node of the switching circuit, a source coupled to a first terminal of a second resistor and a gate coupled to receive a bias voltage, the second terminal of the second resistor being coupled to the upper rail.

14. The DAC as recited in claim 13 wherein the second current buffer comprises the PMOS transistor and the second resistor, the current from the second buffer capacitor being coupled to a point between the PMOS transistor and the second resistor.

15. The DAC as recited in claim 1 wherein the switching circuit, the current source, the first current sink, and the interference cancellation circuit form a DAC element, the DAC comprising a plurality of DAC elements.

16. The DAC as recited in claim 1 wherein the switching circuit comprises first, second, third and fourth switches; the first and second switches being coupled in series between the first node and the second node with the first differential output current originating between the first and second switches; the third and fourth switches being coupled in series between the first node and the second node with the second differential output current originating between the third and fourth switches; the first and fourth switches being controlled by a first control signal of the differential digital control signals and the second and third switches being controlled by a second control signal of the differential digital control signals.

17. An integrated circuit (IC) chip comprising:
a loop filter; and
a digital-to-analog converter (DAC) coupled to provide first and second differential current outputs towards the loop filter, the DAC comprising a plurality of DAC elements, the DAC elements each comprising:
a switching circuit comprising a plurality of switches coupled to receive respective differential digital control signals and to provide respective first and second differential current outputs;
a current source coupled to an upper rail and to a first node of the switching circuit;
a first current sink coupled to a lower rail and to a second node of the switching circuit; and
an interference cancellation circuit coupled to substantially prevent a tail capacitance current from flowing through the first and second differential current outputs.

18. The IC chip as recited in claim 17 further comprising an analog-to-digital converter (ADC), wherein the DAC comprises a portion of a feedback loop of the ADC and the loop filter is coupled to receive a difference signal that is the difference between an input signal to the ADC and the output of the DAC.

* * * * *